US012394599B2

(12) United States Patent
Takahashi et al.

(10) Patent No.: US 12,394,599 B2
(45) Date of Patent: Aug. 19, 2025

(54) PLASMA PROCESSING APPARATUS AND PLASMA PROCESSING METHOD

(71) Applicant: Tokyo Electron Limited, Tokyo (JP)

(72) Inventors: Shingo Takahashi, Miyagi (JP); Jenhung Huang, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/229,678

(22) Filed: Aug. 3, 2023

(65) Prior Publication Data

US 2023/0377844 A1    Nov. 23, 2023

Related U.S. Application Data

(63) Continuation of application No. PCT/JP2022/002243, filed on Jan. 21, 2022.

(30) Foreign Application Priority Data

Feb. 4, 2021    (JP) ................. 2021-016592

(51) Int. Cl.
*H01J 37/32*    (2006.01)

(52) U.S. Cl.
CPC .. *H01J 37/32174* (2013.01); *H01J 37/32449* (2013.01); *H01J 37/32816* (2013.01); *H01J 2237/182* (2013.01); *H01J 2237/332* (2013.01)

(58) Field of Classification Search
CPC ..... C23C 16/50; C23C 16/503; C23C 16/505; H01J 37/32816; H01J 37/32642
See application file for complete search history.

(56) References Cited

U.S. PATENT DOCUMENTS 7,615,132 B2 *   11/2009   Yasui ................ H01J 37/32706
                                                      156/345.43
2003/0164142 A1 *   9/2003   Koshimizu ....... H01J 37/32642
                                                      118/409

(Continued)

FOREIGN PATENT DOCUMENTS

CA    111430209 A    7/2020
JP    2001-156051 A   6/2001

(Continued)

OTHER PUBLICATIONS

International Search Report and Written Opinion mailed on Mar. 22, 2022, received for PCT Application PCT/JP2022/002243, filed on Jan. 21, 2022, 9 pages including English Translation.

*Primary Examiner* — Joseph A Miller, Jr.
(74) *Attorney, Agent, or Firm* — XSENSUS LLP

(57) ABSTRACT

A plasma processing apparatus disclosed includes a chamber, a substrate support, a radio-frequency power supply, and a bias power supply. The substrate support includes an electrode and is provided in the chamber. The radio-frequency power supply supplies radio-frequency power for generating plasma from a gas in the chamber. The bias power supply is electrically coupled to the electrode of the substrate support. The radio-frequency power supply is configured to supply the radio-frequency power in an ignition period in which the plasma is ignited in the chamber. The bias power supply is configured to sequentially apply a plurality of bias pulses, each of which has a negative voltage, to the electrode of the substrate support, and stepwisely or gradually increase absolute values of voltage levels of the plurality of bias pulses in the ignition period.

18 Claims, 10 Drawing Sheets

(56) References Cited

U.S. PATENT DOCUMENTS

| | | | |
|---|---|---|---|
| 2008/0236751 A1* | 10/2008 | Aramaki | H01J 37/32192 |
| | | | 156/345.43 |
| 2009/0321391 A1* | 12/2009 | Ichino | H01L 21/6833 |
| | | | 216/61 |
| 2015/0262704 A1 | 9/2015 | Drewery | |
| 2018/0053661 A1 | 2/2018 | Park et al. | |

FOREIGN PATENT DOCUMENTS

| | | |
|---|---|---|
| JP | 2003-038950 A | 2/2003 |
| JP | 2007-081208 A | 3/2007 |
| JP | 2009-033080 A | 2/2009 |
| KR | 10-2010-0034703 A | 4/2010 |
| KR | 10-2020-0144488 A | 12/2020 |

* cited by examiner

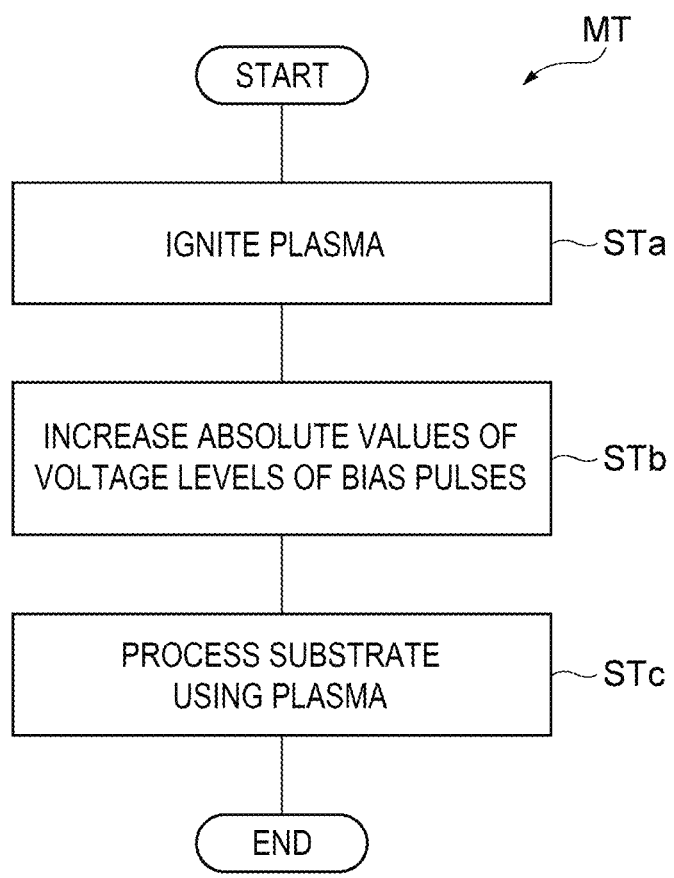

PLASMA PROCESSING APPARATUS AND PLASMA PROCESSING METHOD

CROSS-REFERENCE TO RELATED APPLICATIONS

This application is a bypass continuation application of international application No. PCT/JP2022/002243 having an international filing date of Jan. 21, 2022 and designating the United States, the international application being based upon and claiming the benefit of priority from Japanese Patent Application No. 2021-016592, filed on Feb. 4, 2021, the entire contents of each are incorporated herein by reference.

TECHNICAL FIELD

Exemplary embodiments of the present disclosure relate to a plasma processing apparatus and a plasma processing method.

BACKGROUND

A plasma processing apparatus is used in substrate processing. One type of plasma processing apparatus includes a chamber, a substrate support, a radio-frequency power supply, and a bias power supply. The substrate support includes an electrode and is provided in the chamber. The radio-frequency power supply supplies radio-frequency power for generating plasma from a gas in the chamber. The bias power supply provides bias energy to the electrode of the substrate support to draw ions into a substrate. Patent Document 1 below describes use of a negative direct-current voltage pulse as the bias energy.

PRIOR ART DOCUMENTS

Patent Documents

Patent Document 1: JP-A-2019-036658

SUMMARY

Technical Problem

The present disclosure provides a technique for reducing power of reflected waves of radio-frequency power in an ignition period of plasma.

Solution to Problem

In an exemplary embodiment, a plasma processing apparatus is provided. The plasma processing apparatus includes a chamber, a substrate support, a radio-frequency power supply, and a bias power supply. The substrate support includes an electrode and is provided in the chamber. The radio-frequency power supply supplies radio-frequency power for generating plasma from a gas in the chamber. The bias power supply is electrically coupled to the electrode of the substrate support. The radio-frequency power supply is configured to supply the radio-frequency power in an ignition period in which the plasma is ignited in the chamber. The bias power supply is configured to sequentially apply a plurality of bias pulses, each of which has a negative voltage, to the electrode of the substrate support in the ignition period, and stepwisely or gradually increase absolute values of voltage levels of the plurality of bias pulses.

Advantageous Effects of the Invention

According to the exemplary embodiment, power of reflected waves of radio-frequency power in an ignition period of plasma can be reduced.

BRIEF DESCRIPTION OF DRAWINGS

FIG. 6 is a flowchart of a plasma processing method according to an exemplary embodiment.

DETAILED DESCRIPTION

Figure 1:
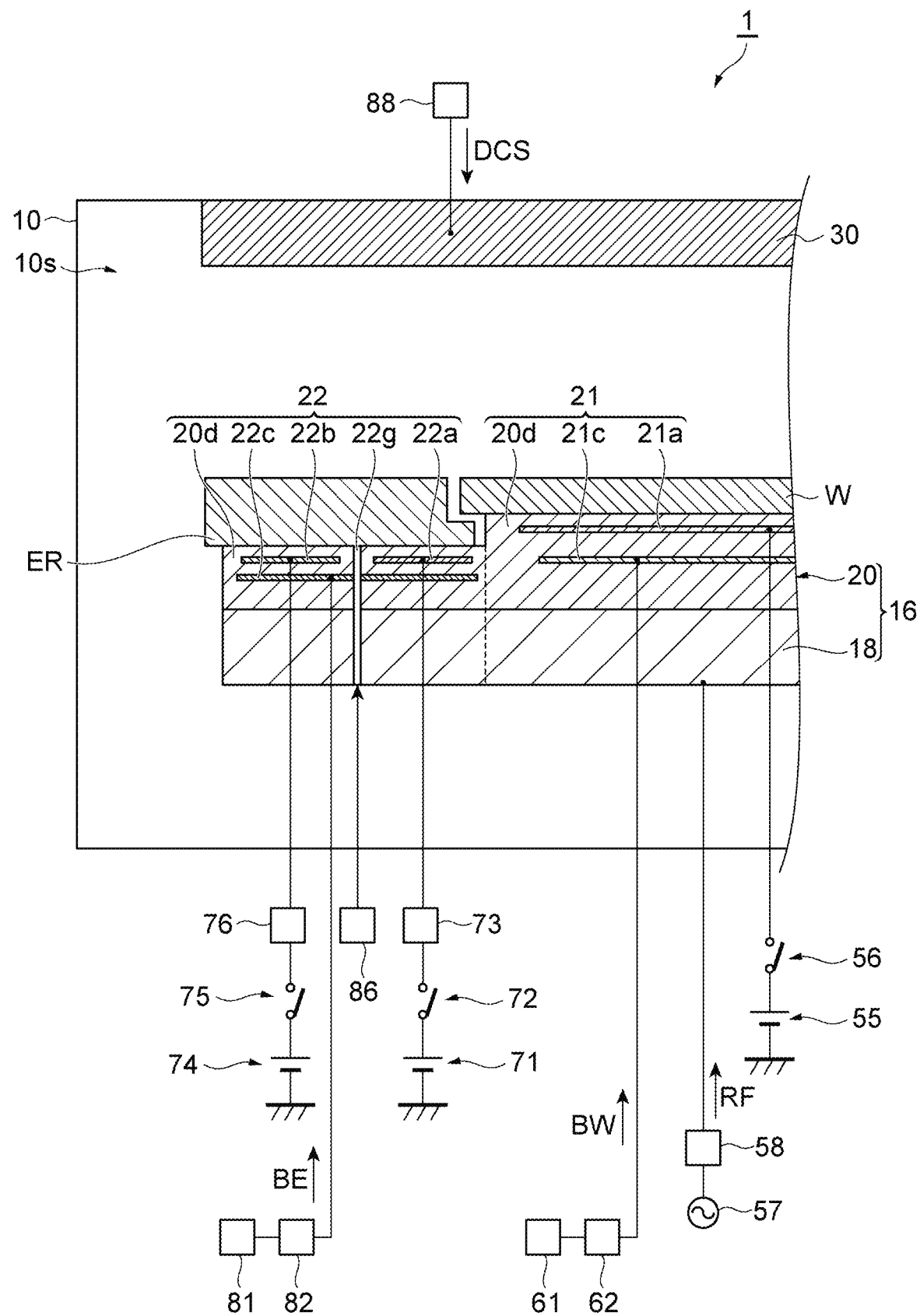
FIG. 1 is a diagram schematically showing a plasma processing apparatus according to an exemplary embodiment.

Hereinafter, various exemplary embodiments will be described.

In an exemplary embodiment, a plasma processing apparatus is provided. The plasma processing apparatus includes a chamber, a substrate support, a radio-frequency power supply, and a bias power supply. The substrate support includes an electrode and is provided in the chamber. The radio-frequency power supply supplies radio-frequency power for generating plasma from a gas in the chamber. The bias power supply is electrically coupled to the electrode of the substrate support. The radio-frequency power supply is configured to supply the radio-frequency power in an ignition period in which the plasma is ignited in the chamber. The bias power supply is configured to sequentially apply a plurality of bias pulses, each of which has a negative voltage, to the electrode of the substrate support in the ignition period, and stepwisely or gradually increase absolute values of voltage levels of the plurality of bias pulses.

When the absolute values of the voltage levels of the bias pulses are rapidly increased, power of reflected waves of the radio-frequency power is increased. In the above embodiment, the levels of the plurality of bias pulses are stepwisely or gradually increased in the ignition period of the plasma. Therefore, according to the above embodiment, the power of the reflected waves of the radio-frequency power is reduced. In addition, since the power of the reflected waves is reduced, the plasma can be stably generated in a short time, and a time length until start of substrate processing by the plasma can be shortened.

In one exemplary embodiment, the bias power supply may set the absolute value of the voltage level of each of the plurality of bias pulses to a value larger than an absolute value of a voltage level of any bias pulse that is previously applied to the electrode of the substrate support. That is, the absolute values of the voltage levels of the plurality of bias pulses sequentially applied to the electrode of the substrate support in the ignition period of the plasma may be ramped up.

In one exemplary embodiment, each of the plurality of bias pulses may be a direct-current voltage pulse.

In one exemplary embodiment, the radio-frequency power supply supplies the radio-frequency power also in a process period in which a substrate is processed in the chamber using the plasma after the ignition period. The bias power supply sequentially applies a plurality of bias pulses, each of which has a negative voltage, to the electrode also in the process period.

In one exemplary embodiment, the plasma processing apparatus may further include a pressure controller configured to adjust a pressure in the chamber. The pressure controller may set a pressure in the chamber in the process period to a pressure different from a pressure in the chamber in the ignition period. The pressure controller may set the pressure in the chamber in the process period to a pressure lower than the pressure in the chamber in the ignition period.

In one exemplary embodiment, the radio-frequency power supply may set a frequency of the radio-frequency power in the process period to a frequency different from a frequency of the radio-frequency power in the ignition period. The radio-frequency power supply may set the frequency of the radio-frequency power in the process period to a frequency lower than the frequency of the radio-frequency power in the ignition period.

In one exemplary embodiment, the radio-frequency power supply may set a power level of the radio-frequency power in the process period to a power level different from a power level of the radio-frequency power in the ignition period. The radio-frequency power supply may set the power level of the radio-frequency power in the process period to a power level higher than the power level of the radio-frequency power in the ignition period.

In one exemplary embodiment, the plasma processing apparatus may further include a gas supply configured to supply gases to the chamber. The plasma processing apparatus generates the plasma in the chamber from the gases supplied from the gas supply. The gas supply may set a flow rate of at least one gas supplied to the chamber in the process period to a flow rate different from a flow rate of the at least one gas supplied to the chamber in the ignition period.

In one exemplary embodiment, each of the ignition period and the process period may include a plurality of periodic pulse periods. The bias power supply may apply the plurality of bias pulses to the electrode in an ON period of each of the plurality of pulse periods. In this case, the bias power supply applies the plurality of bias pulses to the electrode in a bias cycle shorter than a pulse cycle that is a time interval of the ON period in the ON period of each of the plurality of pulse periods. The bias power supply may stop the application of the plurality of bias pulses to the electrode in an OFF period of each of the plurality of pulse periods.

In one exemplary embodiment, the bias power supply may adjust a duty ratio that is a ratio of a time length of each ON period to a time length of the pulse cycle. The bias power supply may set a duty ratio in the process period to a ratio different from a duty ratio in the ignition period. The bias power supply may set the duty ratio in the process period to a ratio smaller than the duty ratio in the ignition period.

In one exemplary embodiment, the substrate support may support an edge ring placed thereon. The plasma processing apparatus may apply the plurality of bias pulses, each of which has a negative voltage, to the edge ring.

In another exemplary embodiment, a plasma processing method is provided. The plasma processing method includes a step of igniting plasma in a chamber of a plasma processing apparatus in an ignition period. The plasma processing apparatus includes a substrate support that includes an electrode and is provided in the chamber. The plasma processing method further includes a step of successively applying a plurality of bias pulses to the electrode in the ignition period. The plurality of bias pulses have negative voltages, and absolute values of voltage levels of the plurality of bias pulses are stepwisely or gradually increased in the ignition period.

Hereinafter, various exemplary embodiments will be described in detail with reference to the drawings. Further, like reference numerals will be given to like or corresponding parts throughout the drawings.

Figure 2:
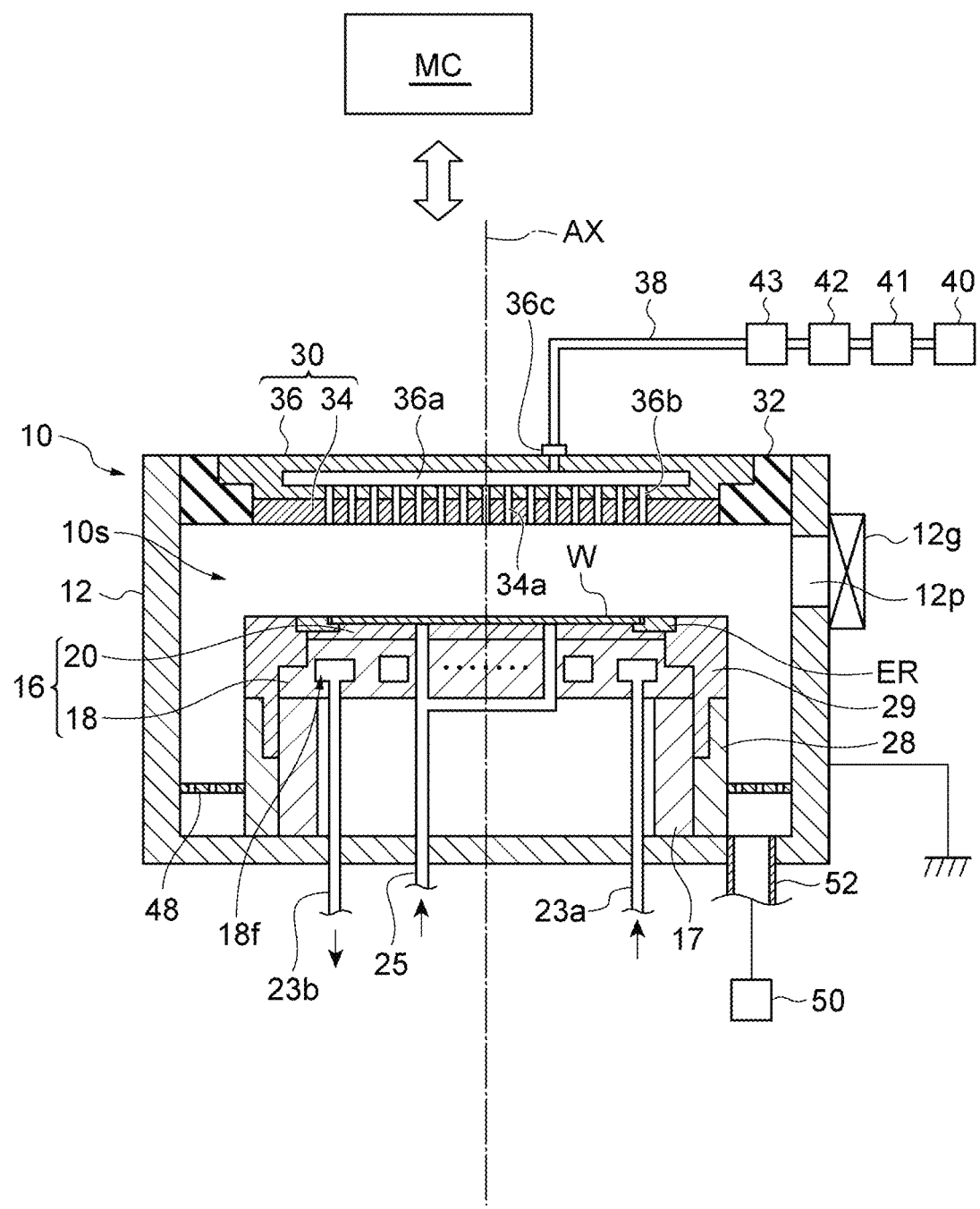
FIG. 2 is a diagram showing a configuration in the chamber of the plasma processing apparatus according to the exemplary embodiment.

FIG. 1 is a diagram schematically showing a plasma processing apparatus according to an exemplary embodiment. A plasma processing apparatus 1 shown in FIG. 1 includes a chamber 10. FIG. 2 is a diagram showing a configuration in the chamber of the plasma processing apparatus according to the exemplary embodiment. As shown in FIG. 2, the plasma processing apparatus 1 may be a capacitively-coupled plasma processing apparatus.

The chamber 10 provides an interior space 10s therein. A central axis of the interior space 10s is an axis AX extending in a vertical direction. In an embodiment, the chamber 10 includes a chamber body 12. The chamber body 12 has a substantially cylindrical shape. The interior space 10s is provided in the chamber body 12. The chamber body 12 is made of, e.g., aluminum. The chamber body 12 is electrically grounded. An inner wall surface of the chamber body 12, that is, a wall surface defining the interior space 10s may be covered with a plasma-resistant film. This film may be a film formed by anodization or a ceramic film such as a film formed of yttrium oxide.

A passage 12p is provided on a side wall of the chamber body 12. A substrate W passes through the passage 12p when being transferred between the interior space 10s and an outside of the chamber 10. A gate valve 12g is provided along the side wall of the chamber body 12 to open and close the passage 12p.

The plasma processing apparatus 1 is further provided with a substrate support 16. The substrate support 16 supports the substrate W placed thereon in the chamber 10. The substrate W has a substantially disk shape. The substrate support 16 is supported by a support 17. The support 17 extends upward from a bottom of the chamber body 12. The support 17 has a substantially cylindrical shape. The support 17 is formed of an insulating material such as quartz.

In the embodiment, the substrate support 16 includes a lower electrode 18 and an electrostatic chuck 20. The lower electrode 18 and the electrostatic chuck 20 are provided in the chamber 10. The lower electrode 18 is formed of a conductive material such as aluminum and has a substantially disk shape.

A flow path 18f is provided in an inside of the lower electrode 18. The flow path 18f is a flow path for a heat exchange medium. The heat exchange medium is, for example, a liquid coolant. The flow path 18f receives a heat exchange medium supplied from a heat exchange medium supply device (for example, a chiller unit) through a pipe 23a. The supply device is provided outside the chamber 10. The heat exchange medium supplied to the flow path 18f flows through the flow path 18f and returns to the supply device through a pipe 23b.

The electrostatic chuck 20 is provided on the lower electrode 18. As shown in FIG. 1, the electrostatic chuck 20 includes a dielectric portion 20d and an electrode 21a. The electrostatic chuck 20 may further include an electrode 22a and an electrode 22b. The substrate W is placed on the electrostatic chuck 20 and held by the electrostatic chuck 20 when being processed in the interior space 10s. In addition, the substrate support 16 supports an edge ring ER placed thereon. The edge ring ER is a plate having a substantially annular shape. The edge ring ER may have electrical conductivity. The edge ring ER is formed of, for example, silicon or silicon carbide. As shown in FIG. 2, the edge ring ER is placed on the substrate support 16 such that a central axis thereof coincides with the axis AX. The substrate W accommodated in the chamber 10 is disposed on the electrostatic chuck 20 and in a region surrounded by the edge ring ER.

The plasma processing apparatus 1 may further include a gas line 25. The gas line 25 supplies a heat transfer gas, for example, a He gas, from a gas supply mechanism to a gap between an upper surface of the electrostatic chuck 20 (first region to be described later) and a rear surface (lower surface) of the substrate W.

The plasma processing apparatus 1 may further include an outer peripheral portion 28 and an outer peripheral portion 29. The outer peripheral portion 28 extends upward from the bottom of the chamber body 12. The outer peripheral portion 28 is substantially cylindrical and extends along the outer periphery of the support 17. The outer peripheral portion 28 is substantially cylindrical and formed from a conductive material. The outer peripheral portion 28 is electrically grounded. A surface of the outer peripheral portion 28 may be covered with a plasma-resistant film. This film may be a film formed by anodization or a ceramic film such as a film formed of yttrium oxide.

The outer peripheral portion 29 is located on the outer peripheral portion 28. The outer peripheral portion 29 is formed from an insulating material. The outer peripheral portion 29 is substantially cylindrical and is formed from, for example, ceramic such as quartz. The outer peripheral portion 29 has a substantially cylindrical shape. The outer peripheral portion 29 extends along the outer peripheries of the lower electrode 18 and the electrostatic chuck 20.

The plasma processing apparatus 1 is further provided with an upper electrode 30. The upper electrode 30 is provided above the substrate support 16. The upper electrode 30 closes an upper opening of the chamber body 12 together with a member 32. The member 32 has an insulating property. The upper electrode 30 is supported on an upper portion of the chamber body 12 through the member 32.

The upper electrode 30 may include a ceiling plate 34 and a support 36. A lower surface of the ceiling plate 34 defines the interior space 10s. A plurality of gas holes 34a are provided on the ceiling plate 34. Each of the plurality of gas holes 34a penetrates the ceiling plate 34 in a plate thickness direction (vertical direction). The ceiling plate 34 is formed of, for example, silicon. Alternatively, the ceiling plate 34 may have a structure in which a plasma-resistant film is provided on a surface of a member made of aluminum. This film may be a film formed by anodization or a ceramic film such as a film formed of yttrium oxide.

The support 36 detachably supports the ceiling plate 34. The support 36 is formed from a conductive material such as aluminum. A gas diffusion chamber 36a is provided in an inside of the support 36. A plurality of gas holes 36b are further provided on the support 36. The plurality of gas holes 36b extend downward from the gas diffusion chamber 36a. The plurality of gas holes 36b communicate with the plurality of gas holes 34a, respectively. A gas introduction port 36c is further provided on the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding valve of the valve group 41, a corresponding flow rate controller of the flow rate controller group 42, and a corresponding valve of the valve group 43. The plasma processing apparatus 1 can supply a gas from one or more gas sources selected from the plurality of gas sources of the gas source group 40 to the interior space 10s at an individually adjusted flow rate.

A baffle plate 48 is located between the outer peripheral portion 28 and the side wall of the chamber body 12. The baffle plate 48 may include, for example, an aluminum member covered with ceramic such as yttrium oxide. The baffle plate 48 has many through-holes. An exhaust pipe 52 is connected to the bottom of the chamber body 12 below the baffle plate 48. An exhaust device 50 is connected to the exhaust pipe 52. The exhaust device 50 includes a pressure controller such as an automatic pressure control valve, and a vacuum pump such as a turbo molecular pump, and can reduce a pressure in the interior space 10s.

Figure 3:
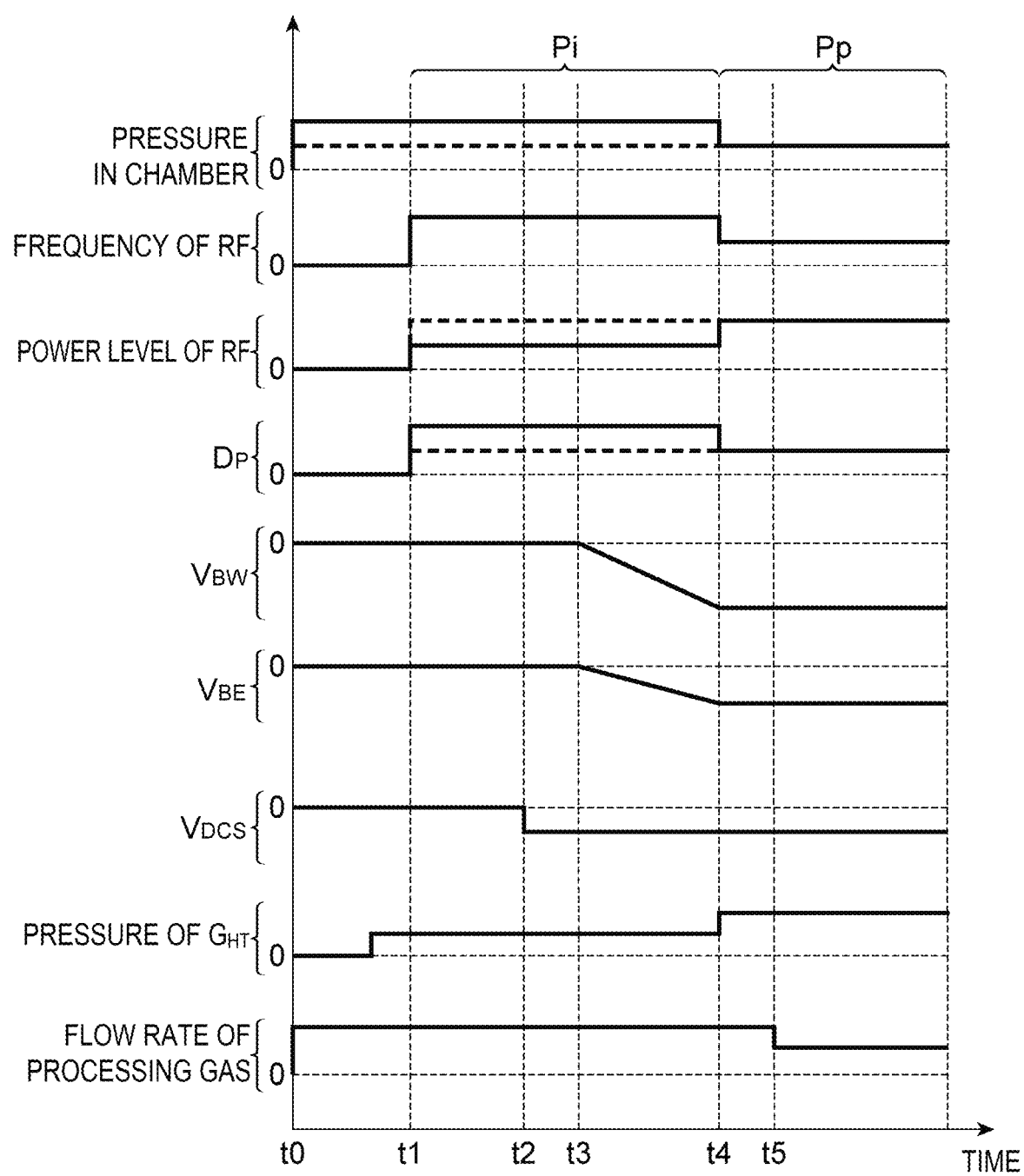
FIG. 3 is a timing chart of an example of processing in the plasma processing apparatus shown in FIG. 1.
Figure 4:
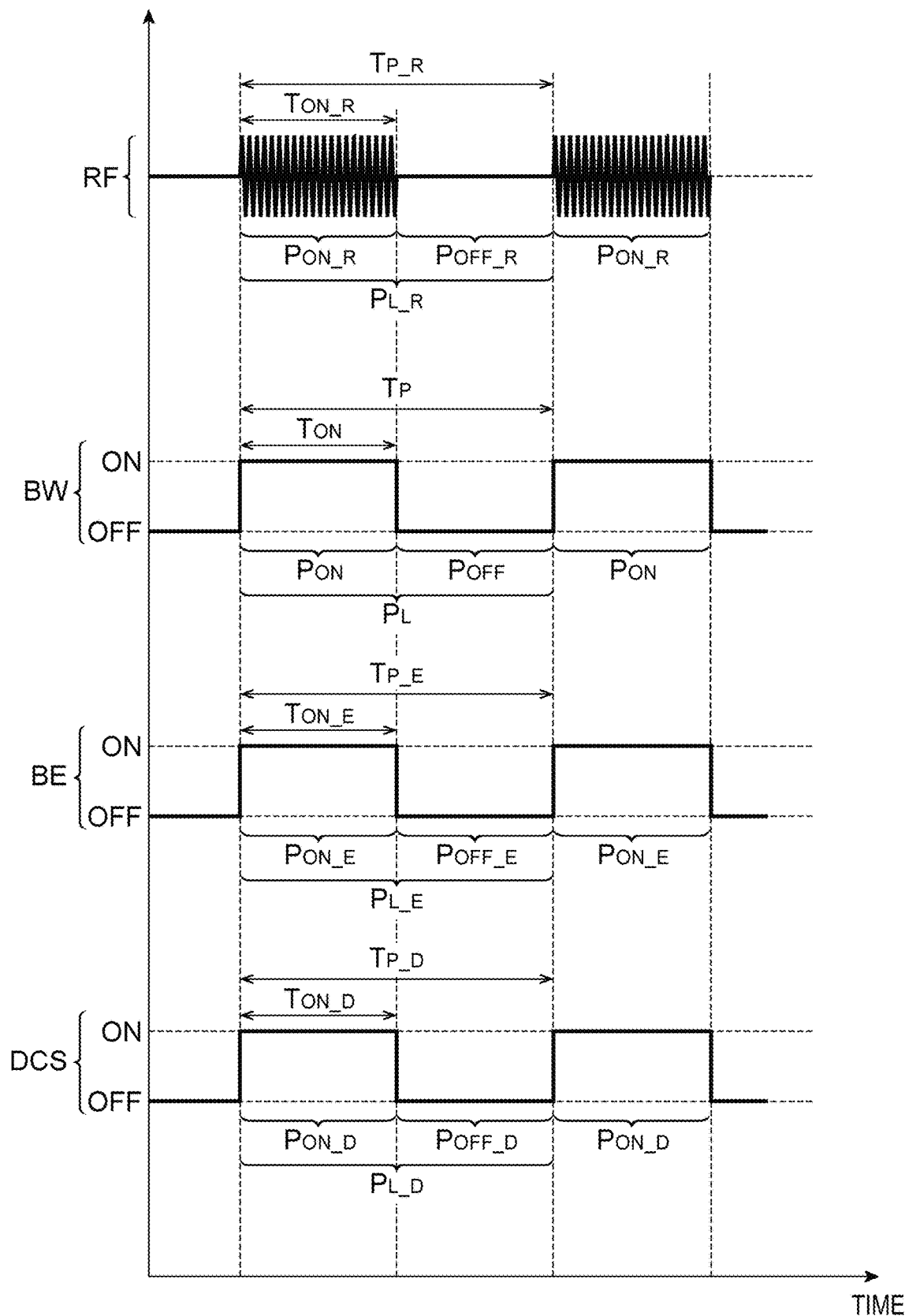
FIG. 4 is a timing chart of an example of processing in the plasma processing apparatus shown in FIG. 1.
Figure 5:
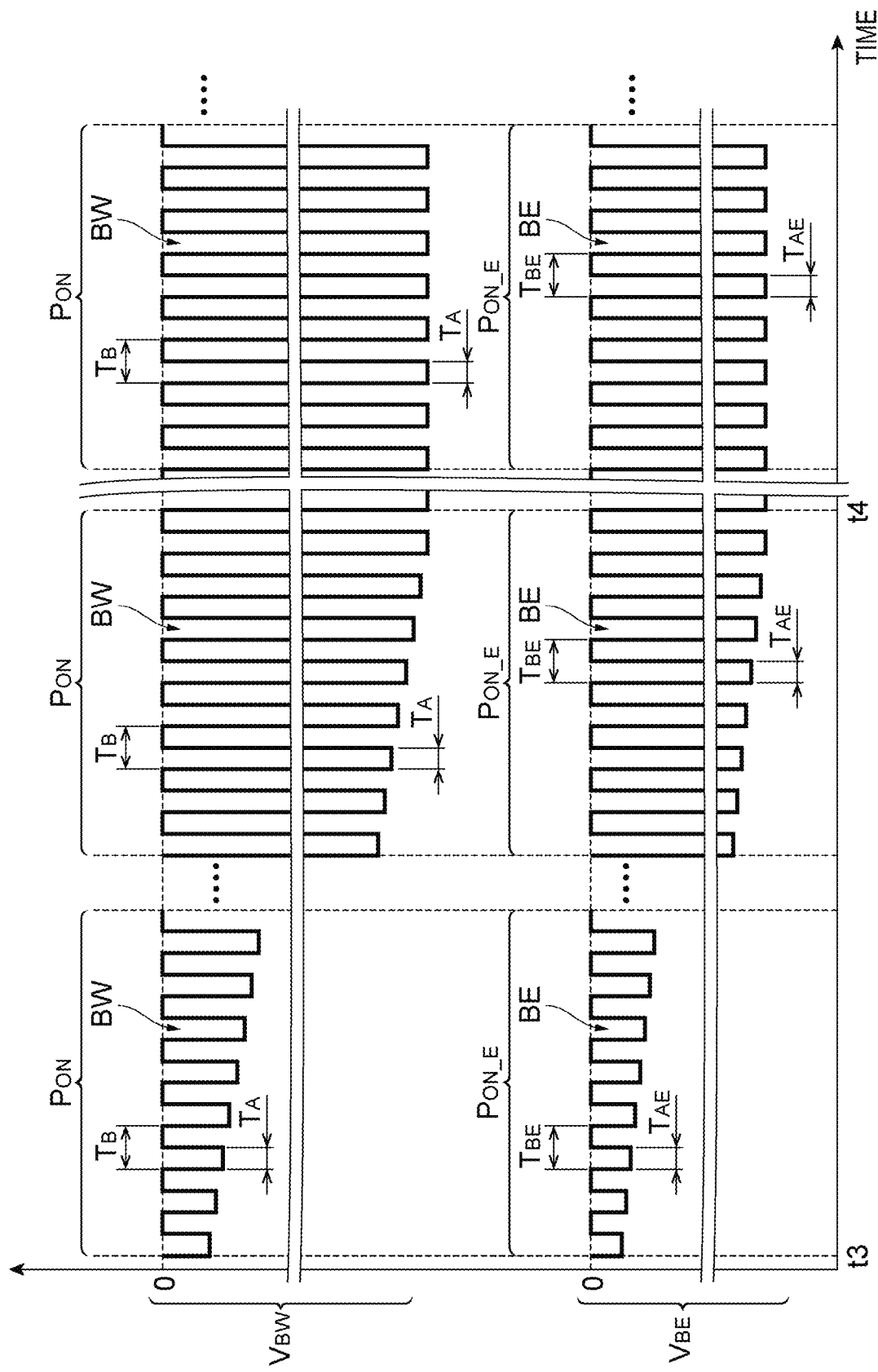
FIG. 5 is a timing chart of an example of a bias pulse for a substrate and a bias pulse for an edge ring.

FIGS. 3 to 5 will be referred to together with FIGS. 1 and 2 below. FIGS. 3 and 4 are timing charts of examples of processing in the plasma processing apparatus shown in FIG. 1. FIG. 5 is a timing chart of an example of a bias pulse for a substrate and a bias pulse for an edge ring.

As shown in FIG. 1, the plasma processing apparatus 1 further includes a radio-frequency power supply 57. The radio-frequency power supply 57 is coupled to the lower electrode 18 through a matcher 58. The radio-frequency power supply 57 is a power supply that generates radio-frequency power RF for plasma generation. The radio-frequency power RF has a frequency in a range of 27 MHz to 100 MHz, for example, a frequency of 40 MHz or 60 MHz. The matcher 58 includes a matching circuit for matching impedance of the radio-frequency power supply 57 on a load side (lower electrode 18 side) with output impedance of the radio-frequency power supply 57. The radio-frequency power supply 57 may not be electrically coupled to the lower electrode 18, and may be coupled to the upper electrode 30 through the matcher 58.

In the plasma processing apparatus 1, a radio-frequency electric field is generated in the chamber 10 by the radio-frequency power RF from the radio-frequency power supply 57. A gas in the chamber 10 is excited by the generated radio-frequency electric field. As a result, plasma is ignited and generated in the chamber 10. As shown in FIG. 3, the radio-frequency power supply 57 supplies the radio-frequency power RF in both an ignition period Pi and a process period Pp. The ignition period Pi is a period in which the plasma is ignited in the chamber 10. The process period Pp is a period after the ignition period Pi. The substrate W is processed with chemical species such as ions and/or radicals from the plasma generated in the chamber 10 in the process period Pp.

As shown in FIG. 1, in the embodiment, the substrate support 16 may include a first region 21 and a second region 22. The first region 21 is a central region of the substrate support 16. The first region 21 includes a central region of the electrostatic chuck 20 and a central region of the lower electrode 18. The second region 22 extends radially outside the first region 21 in a circumferential direction. The second region 22 includes a peripheral region of the electrostatic chuck 20 and a peripheral region of the lower electrode 18. In the plasma processing apparatus 1, the first region 21 and the second region 22 are constituted by a single electrostatic chuck, and are integrated with each other. In FIG. 1, a boundary between the first region 21 and the second region 22 is indicated by a broken line. In another embodiment, the first region 21 and the second region 22 may be constituted by separate electrostatic chucks.

The first region 21 supports the substrate W placed thereon (that is, placed on an upper surface thereof). The first region 21 is a region having a disk shape. A central axis of the first region 21 substantially coincides with the axis AX. The first region 21 shares the dielectric portion 20d with the second region 22. The dielectric portion 20d is formed of a dielectric such as aluminum nitride or aluminum oxide. The dielectric portion 20d has a substantially disk shape. In the embodiment, a thickness of the dielectric portion 20d in the second region 22 is smaller than a thickness of the dielectric portion 20d in the first region 21. A position of an upper surface of the dielectric portion 20d in the second region 22 in the vertical direction may be lower than a position of the upper surface of the dielectric portion 20d in the first region 21 in the vertical direction.

The first region 21 has the electrode 21a (chuck electrode). The electrode 21a is a film-like electrode, and is provided in the dielectric portion 20d within the first region 21. The electrode 21a is coupled to a direct-current power supply 55 through a switch 56. When a direct-current voltage from the direct-current power supply 55 is applied to the electrode 21a, an electrostatic attraction force is generated between the first region 21 and the substrate W. Due to the generated electrostatic attraction force, the substrate W is attracted to the first region 21 and held by the first region 21.

The first region 21 further has a first electrode 21c. The first electrode 21c is a film-like electrode, and is provided in the dielectric portion 20d within the first region 21. The electrode 21a may extend nearer the upper surface of the first region 21 than the first electrode 21c in the vertical direction.

The plasma processing apparatus 1 further includes a first bias power supply 61. The first bias power supply 61 is electrically coupled to the first electrode 21c. The first bias power supply 61 may be coupled to the first electrode 21c through a filter 62. The filter 62 is an electric filter that blocks or attenuates the radio-frequency power RF from the radio-frequency power supply 57.

As shown in FIGS. 1 and 5, the first bias power supply 61 sequentially applies a plurality of bias pulses BW to the first electrode 21c. Each of the plurality of bias pulses BW is a voltage pulse. In the embodiment, each of the plurality of bias pulses BW is a negative voltage pulse. In an example, the negative voltage pulse is a negative direct-current voltage pulse. An output voltage of the first bias power supply 61 may be 0 V when the bias pulses BW are not output. Alternatively, the output voltage of the first bias power supply 61 has a voltage level of an absolute value smaller than absolute values $|V_{BW}|$ of voltage levels $V_{BW}$ of the bias pulses BW when the bias pulses BW are not output.

The first bias power supply 61 may periodically apply the bias pulses BW to the first electrode 21c at a time interval $T_B$ specified by a bias frequency $f_B$. The time interval $T_B$ is a bias cycle, and is a reciprocal of the bias frequency $f_B$. The bias frequency $f_B$ is, for example, a frequency within a range of 200 kHz to 13.56 MHz. A percentage of a period (time length $T_A$) in which the bias pulses BW are applied to the first electrode 21c at the time interval $T_B$ (that is, duty ratio $D_B=T_A/T_B\times100(\%)$) is larger than 0 and smaller than 100.

In the embodiment, each of the above ignition period Pi and the process period Pp may include a plurality of periodic pulse periods $P_L$. As shown in FIG. 4, each of the plurality of pulse periods $P_L$ includes an ON period $P_{ON}$ and an OFF period $P_{OFF}$. That is, the ON period $P_{ON}$ appears at the same time interval $T_P$ as a time length of the plurality of pulse periods $P_L$. The first bias power supply 61 may apply the plurality of bias pulses BW to the first electrode 21c in the ON period $P_{ON}$ of each of the plurality of periodic pulse periods $P_L$. The first bias power supply 61 may stop the application of the bias pulses BW to the first electrode 21c in the OFF period $P_{OFF}$ of each of the plurality of pulse periods $P_L$. A percentage of the ON period $P_{ON}$ (time length $T_{ON}$) at the time interval $T_P$ (that is, duty ratio $D_P=T_{ON}/T_P\times100(\%)$) is larger than 0 and smaller than 100. The bias cycle described above, that is, the time interval $T_B$ is shorter than the pulse cycle, that is, the time interval $T_P$ of the ON period $P_{ON}$. Therefore, as shown in FIG. 5, in each ON period $P_{ON}$, some bias pulses BW are sequentially applied to the first electrode 21c at the time interval $T_B$.

As shown in FIG. 1, the second region 22 extends to surround the first region 21. The second region 22 is a substantially annular region. A central axis of the second region 22 substantially coincides with the axis AX. The second region 22 supports the edge ring ER placed thereon (that is, placed on an upper surface thereof). The second region 22 shares the dielectric portion 20d with the first region 21.

In the embodiment, the second region 22 may hold the edge ring ER by an electrostatic attraction force. In the embodiment, the second region 22 may have one or more electrodes (chuck electrodes). In the embodiment shown in FIG. 1, the second region 22 has a pair of electrodes, that is, the electrodes 22a and 22b. The electrodes 22a and 22b are provided in the dielectric portion 20d within the second region 22. The electrodes 22a and 22b constitute a bipolar electrode. Each of the electrodes 22a and 22b is a film-like electrode. The electrodes 22a and 22b may extend at substantially the same height position in the vertical direction.

The electrode 22a is coupled to a direct-current power supply 71 through a switch 72 and a filter 73. The filter 73 is an electric filter that blocks or attenuates the radio-frequency power RF, the bias pulses BW, and bias pulses BE to be described later. The electrode 22b is coupled to a direct-current power supply 74 through a switch 75 and a filter 76. The filter 76 is an electric filter that blocks or reduces the radio-frequency power RF, the bias pulses BW, and the bias pulses BE.

The direct-current power supplies 71 and 74 respectively apply direct-current voltages to the electrodes 22a and 22b to generate an electrostatic attraction force for attracting the edge ring ER to the second region 22. A set potential of each of the electrodes 22a and 22b may be any of a positive potential, a negative potential, and 0 V. For example, the potential of the electrode 22a may be set to a positive potential, and the potential of the electrode 22b may be set to a negative potential. In addition, a potential difference between the electrodes 22a and 22b may be formed by using a single direct-current power supply, instead of two direct-current power supplies.

When the direct-current voltages are applied to the electrodes 22a and 22b, the electrostatic attraction force is generated between the second region 22 and the edge ring ER. The edge ring ER is attracted to the second region 22 by the generated electrostatic attraction force and is held by the second region 22.

The second region 22 may further have a gas line 22g. The gas line 22g is a gas line provided to supply a heat transfer gas $G_{HT}$, for example, a He gas, to a gap between the second region 22 and the edge ring ER. The gas line 22g is connected to a gas supply mechanism 86, which is a source of the heat transfer gas $G_{HT}$.

The second region 22 may further have a second electrode 22c. The second electrode 22c is a film-like electrode. The second electrode 22c is provided in the dielectric portion 20d within the second region 22. The second electrode 22c is separated from the first electrode 21c. The electrodes 22a and 22b may extend nearer the upper surface of the second region 22 than the second electrode 22c in the vertical direction. The second electrode 22c may be disposed outside the second region 22. For example, the second electrode 22c may be provided below the edge ring ER and in the outer peripheral portion 29.

The plasma processing apparatus 1 may further include a second bias power supply 81. The second bias power supply 81 is electrically coupled to the second electrode 22c. The second bias power supply 81 may be coupled to the second electrode 22c through a filter 82. The filter 82 is an electric filter that blocks or attenuates the radio-frequency power RF.

As shown in FIGS. 1 and 5, the second bias power supply 81 successively applies a plurality of bias pulses BE to the second electrode 22c. The plurality of bias pulses BE are applied to the edge ring ER through the second electrode 22c. Each of the plurality of bias pulses BE is a voltage pulse. In the embodiment, each of the plurality of bias pulses BE is a negative voltage pulse. In an example, the negative voltage pulse is a negative direct-current voltage pulse. An output voltage of the second bias power supply 81 may be 0 V when the bias pulses BE are not output. Alternatively, the output voltage of the second bias power supply 81 has a voltage level of an absolute value smaller than absolute values $|V_{BE}|$ of voltage levels $V_{BE}$ of the bias pulses BE when the bias pulses BE are not output. The bias pulses BE may be synchronized with the bias pulses BW. The bias pulses BE may not be synchronized with the bias pulses BW.

The second bias power supply 81 may periodically apply the bias pulses BE to the second electrode 22c at a time interval $T_{BE}$. The time interval $T_{BE}$ is a bias cycle, and is a reciprocal of a bias frequency $f_{BE}$. The bias frequency $f_{BE}$ is, for example, a frequency within a range of 200 kHz to 13.56 MHz. The time interval $T_{BE}$ may be the same as the time interval $T_B$ as shown in FIG. 5 or different from the time interval $T_B$.

A percentage of a period (time length $T_{AE}$) in which one bias pulse BE is applied to the second electrode 22c at the time interval $T_{BE}$ (that is, duty ratio $D_{BE}=T_{AE}/T_{BE}\times100(\%)$) is larger than 0 and smaller than 100. The time length $T_{AE}$ may be the same as the time length $T_A$ as shown in FIG. 5 or different from the time length $T_A$. In addition, the duty ratio $D_{BE}$ may be the same as or different from the duty ratio $D_B$.

In the embodiment, each of the above ignition period Pi and the process period Pp may include a plurality of periodic pulse periods $P_{L\_E}$. As shown in FIG. 4, each of the plurality of pulse periods $P_{L\_E}$ includes an ON period $P_{ON\_E}$ and an OFF period $P_{OFF\_E}$. That is, the ON period $P_{ON\_E}$ appears at the same time interval $T_{P\_E}$ as a time length of the plurality of pulse periods $P_{L\_E}$. The second bias power supply 81 may apply the plurality of bias pulses BE to the second electrode 22c in the ON period $P_{ON\_E}$ of each of the plurality of periodic pulse periods $P_{L\_E}$. The second bias power supply 81 may stop the application of the bias pulses BE to the second electrode 22c in the OFF period $P_{OFF\_E}$ of each of the plurality of pulse periods $P_{L\_E}$. A percentage of the ON period $P_{ON\_E}$ (time length $T_{ON\_E}$) at the time interval $T_{P\_E}$ (that is, duty ratio $D_{P\_E}=T_{ON\_E}/T_{P\_E}\times100(\%)$) is larger than 0 and smaller than 100. The bias cycle described above, that is, the time interval $T_{BE}$ is shorter than the pulse cycle, that is, the time interval $T_{P\_E}$ of the ON period $P_{ON\_E}$. Therefore, as shown in FIG. 5, in each ON period $P_{ON\_E}$, some bias pulses BE are sequentially applied to the second electrode 22c at the time interval $T_{BE}$. The ON period $P_{ON\_E}$ may be synchronized with the ON period $P_{ON}$. The ON period $P_{ON\_E}$ may not be synchronized with the ON period $P_{ON}$.

In the embodiment, as shown in FIG. 4, the radio-frequency power supply 57 may supply the radio-frequency power RF in an ON period $P_{ON\_R}$ of each of a plurality of periodic pulse periods $P_{L\_R}$ of each of the ignition period Pi and the process period Pp. That is, the radio-frequency power supply 57 may supply the radio-frequency power RF in the ON period $P_{ON\_R}$ that appears at a time interval $T_{P\_R}$. The radio-frequency power supply 57 may stop the supply of the radio-frequency power RF in an OFF period $P_{OFF\_R}$ of each of the plurality of pulse periods $P_{L\_R}$. A percentage of the ON period $P_{ON\_R}$ (time length $T_{ON\_R}$) at the time interval $T_{P\_R}$ (that is, duty ratio $D_{P\_R}=T_{ON\_R}/T_{P\_R}\times100(\%)$) is larger than 0 and smaller than 100. The ON period $P_{ON\_R}$ may be synchronized with the ON period $P_{ON}$ and the ON period $P_{ON\_E}$. The ON period $P_{ON\_R}$ may not be synchronized with at least one of the ON period $P_{ON}$ and the ON period $P_{ON\_E}$.

In the embodiment, the plasma processing apparatus 1 may further include a power supply 88. The power supply 88 applies a voltage DCS to the upper electrode 30. The power supply 88 may apply the voltage DCS to the upper electrode 30 in each of the ignition period Pi and the process period Pp. The voltage DCS may be a negative voltage. The voltage DCS may be a negative direct-current voltage.

In the embodiment, as shown in FIG. 4, the power supply 88 may apply the voltage DCS to the upper electrode 30 in an ON period $P_{ON\_D}$ of each of a plurality of periodic pulse periods $P_{L\_D}$ of each of the ignition period Pi and the process period Pp. That is, the power supply 88 may apply the voltage DCS to the upper electrode 30 in the ON period $P_{ON\_D}$ that appears at a time interval $T_{P\_D}$. The power supply 88 may stop the application of the voltage DCS in an OFF period $P_{OFF\_D}$ of each of the plurality of pulse periods $P_{L\_D}$. A percentage of the ON period $P_{ON\_D}$ (time length $T_{ON\_D}$) at the time interval $T_{P\_D}$ (that is, duty ratio $D_{P\_D}=T_{ON\_D}/T_{P\_D}\times100(\%)$) is larger than 0 and smaller than 100. The ON period $P_{ON\_D}$ may be synchronized with the ON period $P_{ON}$, the ON period $P_{ON\_R}$, and the ON period $P_{ON\_E}$. The ON period $P_{ON\_D}$ may not be synchronized with at least one of the ON period $P_{ON}$, the ON period $P_{ON\_R}$, and the ON period $P_{ON\_E}$.

In the embodiment, the plasma processing apparatus 1 may further include a controller MC as shown in FIG. 2. The controller MC is a computer that includes a processor, a storage unit, an input unit, a display unit, and the like, and controls each unit of the plasma processing apparatus 1. Specifically, the controller MC executes a control program stored in the storage unit, and controls each unit of the plasma processing apparatus 1 based on recipe data stored in the storage unit. A process designated by the recipe data is performed in the plasma processing apparatus 1 under control by the controller MC.

Hereinafter, a plasma processing method according to an exemplary embodiment will be described with reference to FIGS. 1 to 5, and 6. In addition, a detailed example of operation of each unit of the plasma processing apparatus 1 will be described. FIG. 6 is a flowchart of a plasma processing method according to an exemplary embodiment.

In the plasma processing method shown in FIG. 6 (hereinafter referred to as a "method MT"), the edge ring ER is held by the second region 22, and the substrate W is held by the first region 21 of the substrate support 16. Then, the gas supply supplies processing gases to the chamber 10. In the example shown in FIG. 3, the gas supply supplies the processing gases to the chamber 10 from a time point t0. The supply of the processing gases to the chamber is continued in the ignition period Pi and the process period Pp. In addition, the exhaust device 50 (pressure controller thereof) adjusts a pressure in the chamber 10 to a designated pressure. Further, the gas supply mechanism 86 starts supply of the heat transfer gas $G_{HT}$ at a time point between the time point t0 and a start time point t1 of the ignition period Pi. The heat transfer gas $G_{HT}$ is supplied to the gap between the second region 22 and the edge ring ER. The supply of the heat transfer gases $G_{HT}$ is continued in the ignition period Pi and the process period Pp.

Then, step STa is performed in the ignition period Pi. That is, in the ignition period Pi, the plasma is ignited in the chamber 10. The radio-frequency power supply 57 supplies the radio-frequency power RF in the ignition period Pi. In the example shown in FIG. 3, the supply of the radio-frequency power RF is started at the time point t1.

Step STb is performed in the ignition period Pi. In step STb, the first bias power supply 61 sequentially applies the plurality of bias pulses BW to the first electrode 21c. In the example shown in FIG. 3, the application of the plurality of bias pulses BW to the first electrode 21c is started at a time point t3 after the time point t1, and is continued in the ignition period Pi. In addition, in step STb, the first bias power supply 61 stepwisely or gradually increases the absolute values $|V_{BW}|$ of the voltage levels $V_{BW}$ of the plurality of bias pulses BW.

In the embodiment, in the ignition period Pi, the first bias power supply 61 sets the absolute value of the voltage level of each of the plurality of bias pulses BW to a value larger than an absolute value of a voltage level of any bias pulse BW that is previously applied to the first electrode 21c. That is, as shown in FIG. 5, the absolute values $|V_{BW}|$ of the voltage levels $V_{BW}$ of the plurality of bias pulses BW sequentially applied to the first electrodes 21c in the ignition period Pi may be ramped up.

When the absolute values of the voltage levels of the bias pulses BW are rapidly increased, power of reflected waves of the radio-frequency power RF is increased. In the plasma processing apparatus 1, the levels of the plurality of bias pulses BW are stepwisely or gradually increased in the ignition period Pi. Therefore, according to the plasma processing apparatus 1, the power of the reflected waves of the radio-frequency power RF is reduced. In addition, since the power of the reflected waves is reduced, the plasma can be stably generated in a short time, and a time length until start of a period for the substrate processing by the plasma can be shortened.

In the embodiment, the second bias power supply 81 sequentially applies the plurality of bias pulses BE to the second electrode 22c in the ignition period Pi. The plurality of bias pulses BE are applied to the edge ring ER through the second electrode 22c. In the example shown in FIG. 3, the application of the plurality of bias pulses BE to the second electrode 22c is started at the time point t3 and is continued in the ignition period Pi. In addition, the second bias power supply 81 stepwisely or gradually increases the absolute values $|V_{BE}|$ of the voltage levels $V_{BE}$ of the plurality of bias pulses BE. Also, in this case, the power of the reflected waves of the radio-frequency power RF is reduced.

In the embodiment, in the ignition period Pi, the second bias power supply 81 sets the absolute value of the voltage level of each of the plurality of bias pulses BE to a value larger than an absolute value of a voltage level of any bias pulse BE that is previously applied to the second electrode 22c. That is, as shown in FIG. 5, the absolute values $|V_{BE}|$ of the voltage levels $V_{BE}$ of the plurality of bias pulses BE sequentially applied to the second electrodes 22c in the ignition period Pi may be ramped up.

In the embodiment, the power supply 88 applies the voltage DCS to the upper electrode 30 in the ignition period Pi. In the example shown in FIG. 3, the application of the voltage DCS to the upper electrode 30 is started at the time point t2 between the time point t1 and the time point t3, and is continued in the ignition period Pi (see a voltage level $V_{DCS}$ of the voltage DCS in FIG. 3).

In the method MT, then, step STc is performed. Step STc is performed in the process period Pp after the ignition period Pi. In the example shown in FIG. 3, the process period Pp is started at a time point t4. In the process period Pp, the substrate W is processed in the chamber by plasma continuously generated from the ignition period Pi.

In the embodiment, the gas supply may set a flow rate of at least one gas among the processing gases supplied to the chamber 10 in the process period Pp to a flow rate different from a flow rate of the at least one gas supplied to the chamber 10 in the ignition period Pi. The flow rate of the at least one gas may be changed at a time point t5 after the time point t4. A time length between the time point t4 and the time point t5 is, for example, 0.6 seconds.

The processing gases include, for example, a deposition gas and an oxygen-containing gas. The deposition gas is, for example, a carbon-containing gas such as a fluorocarbon gas. The oxygen-containing gas is, for example, an $O_2$ gas. The gas supply may set a flow rate of the deposition gas supplied to the chamber 10 in the process period Pp to a flow rate smaller than a flow rate of the deposition gas supplied to the chamber 10 in the ignition period Pi. The gas supply may set a flow rate of the oxygen-containing gas supplied to the chamber 10 in the process period Pp to a flow rate larger than a flow rate of the oxygen-containing gas supplied to the chamber 10 in the ignition period Pi.

In the embodiment, the pressure controller of the exhaust device 50 may set a pressure in the chamber 10 in the process period Pp to a pressure different from a pressure in the chamber in the ignition period Pi. The pressure controller may set the pressure in the chamber 10 in the process period Pp to a pressure lower than the pressure in the chamber 10 in the ignition period Pi, as shown by a solid line in FIG. 3. When the pressure in the chamber 10 in the process period Pp is equal to or larger than a threshold value, the pressure controller may set the pressure in the chamber 10 in the ignition period Pi (pressure indicated by a broken line in FIG. 3) to the same pressure as the pressure in the chamber 10 in the process period Pp. When the pressure in the chamber 10 in the process period Pp is smaller than the threshold value, the pressure controller may set the pressure in the chamber 10 in the ignition period Pi to the same value as the threshold value. The threshold value of the pressure in the chamber 10 is, for example, 2.666 Pa (20 mTorr).

The radio-frequency power supply 57 supplies the radio-frequency power RF also in the process period Pp in order to continuously generate the plasma from the processing gases from the ignition period Pi.

In the embodiment, the radio-frequency power supply 57 may set a frequency of the radio-frequency power RF in the process period Pp to a frequency different from a frequency of the radio-frequency power RF in the ignition period Pi. As shown in FIG. 3, the radio-frequency power supply 57 may set the frequency of the radio-frequency power RF in the process period Pp to a frequency lower than the frequency of the radio-frequency power RF in the ignition period Pi.

In the embodiment, the radio-frequency power supply 57 may set a power level of the radio-frequency power RF in the process period Pp to a power level different from a power level of the radio-frequency power RF in the ignition period Pi. The radio-frequency power supply 57 may set the power level of the radio-frequency power RF in the process period Pp to a power level higher than the power level of the radio-frequency power RF in the ignition period Pi, as indicated by a solid line in FIG. 3. When the power level of the radio-frequency power RF in the process period Pp is equal to or lower than a threshold value, the radio-frequency power supply 57 may set the power level of the radio-frequency power RF in the ignition period Pi to the same level as the power level of the radio-frequency power RF in the process period Pp. See the power level of the radio-frequency power RF indicated by a broken line in FIG. 3. When the power level of the radio-frequency power RF in the process period Pp is higher than the threshold value, the radio-frequency power supply 57 may set the power level of the radio-frequency power RF in the ignition period Pi to the same value as the threshold value. The threshold value of power level of the radio-frequency power RF is, for example, 2500 W.

In the embodiment, the radio-frequency power supply 57 may set the duty ratio $D_{P\_R}$ in the process period Pp to a ratio different from the duty ratio $D_{P\_R}$ in the ignition period Pi. The radio-frequency power supply 57 may set the duty ratio $D_{P\_R}$ in the process period Pp to a ratio smaller than the duty ratio $D_{P\_R}$ in the ignition period Pi. When the duty ratio $D_{P\_R}$ in the process period Pp is equal to or larger than a threshold value, the radio-frequency power supply 57 may set the duty ratio $D_{P\_R}$ in the ignition period Pi to the same ratio as the duty ratio $D_{P\_R}$ in the process period Pp. When the duty ratio $D_{P\_R}$ in the process period Pp is smaller than the threshold value, the radio-frequency power supply 57 may set the duty ratio $D_{P\_R}$ in the ignition period Pi to the same value as the threshold value. The threshold value of the duty ratio $D_{P\_R}$ is, for example, 30%.

The first bias power supply 61 successively applies the plurality of bias pulses BW to the first electrode 21c also in the process period Pp. The plurality of bias pulses BW may be sequentially applied to the first electrode 21c in the process period Pp in the same manner as in the ignition period Pi. The voltage levels of the plurality of bias pulses BW may be the same in the process period Pp.

In the embodiment, the first bias power supply 61 may set the duty ratio $D_P$ in the process period Pp to a ratio different from the duty ratio $D_P$ in the ignition period Pi. The first bias power supply 61 may set the duty ratio $D_P$ in the process period Pp to a ratio smaller than the duty ratio $D_P$ in the ignition period Pi, as indicated by a solid line in FIG. 3. When the duty ratio $D_P$ in the process period Pp is equal to or larger than a threshold value, the first bias power supply 61 may set the duty ratio $D_P$ in the ignition period Pi to the same ratio as the duty ratio $D_P$ in the process period Pp, as indicated by a broken line in FIG. 3. When the duty ratio $D_P$ in the process period Pp is smaller than the threshold value, the first bias power supply 61 may set the duty ratio $D_P$ in the ignition period Pi to the same value as the threshold value. The threshold value of the duty ratio $D_P$ is, for example, 30%.

The second bias power supply 81 successively applies the plurality of bias pulses BE to the second electrode 22c also in the process period Pp. The plurality of bias pulses BE may be sequentially applied to the second electrode 22c in the process period Pp in the same manner as in the ignition period Pi. The voltage levels of the plurality of bias pulses BE may be the same in the process period Pp.

In the embodiment, the second bias power supply 81 may set the duty ratio $D_{P\_E}$ in the process period Pp to a ratio different from the duty ratio $D_{P\_E}$ in the ignition period Pi. The second bias power supply 81 may set the duty ratio $D_{P\_E}$ in the process period Pp to a ratio smaller than the duty ratio $D_{P\_E}$ in the ignition period Pi. When the duty ratio $D_{P\_E}$ in the process period Pp is equal to or larger than a threshold value, the second bias power supply 81 may set the duty ratio $D_{P\_E}$ in the ignition period Pi to the same ratio as the duty ratio $D_{P\_E}$ in the process period Pp. When the duty ratio $D_{P\_E}$ in the process period Pp is smaller than the threshold value, the second bias power supply 81 may set the duty ratio $D_{P\_E}$ in the ignition period Pi to the same value as the threshold value. The threshold value of the duty ratio $D_{P\_E}$ is, for example, 30%.

The power supply 88 applies the voltage DCS to the upper electrode 30 also in the process period Pp. A voltage level of the voltage DCS in the process period Pp may be the same as a voltage level of the voltage DCS in the ignition period Pi.

In the embodiment, the power supply 88 may set the duty ratio $D_{P\_D}$ in the process period Pp to a ratio different from the duty ratio $D_{P\_D}$ in the ignition period Pi. The power supply 88 may set the duty ratio $D_{P\_D}$ in the process period Pp to a ratio smaller than the duty ratio $D_{P\_D}$ in the ignition period Pi. When the duty ratio $D_{P\_D}$ in the process period Pp is equal to or larger than a threshold value, the power supply 88 may set the duty ratio $D_{P\_D}$ in the ignition period Pi to the same ratio as the duty ratio $D_{P\_D}$ in the process period Pp. When the duty ratio $D_{P\_D}$ in the process period Pp is smaller than the threshold value, the power supply 88 may set the duty ratio $D_{P\_D}$ in the ignition period Pi to the same value as the threshold value. The threshold value of the duty ratio $D_{P\_D}$ is, for example, 30%.

The gas supply mechanism 86 supplies the heat transfer gas $G_{HT}$ to the gap between the second region 22 and the edge ring ER also in the process period Pp. The gas supply mechanism 86 may set a pressure of the heat transfer gas $G_{HT}$ in the process period Pp to a pressure different from a pressure of the heat transfer gas $G_{HT}$ in the ignition period Pi. The gas supply mechanism 86 may set the pressure of the heat transfer gas $G_{HT}$ in the process period Pp to a pressure higher than the pressure of the heat transfer gas $G_{HT}$ in the ignition period Pi.

While various exemplary embodiments have been described above, various additions, omissions, substitutions and changes may be made without being limited to the exemplary embodiments described above. Indeed, the embodiments described herein may be embodied in a variety of other forms.

For example, in another embodiment, the bias pulses BW from the first bias power supply 61 may be applied to the lower electrode 18. In this case, the plasma processing apparatus 1 may not include the first electrode 21c. The bias pulses BW from the first bias power supply 61 may be applied to the electrode 21a. Also, in this case, the plasma processing apparatus 1 may not include the first electrode 21c.

In another embodiment, the bias pulses BE from the second bias power supply 81 may be applied to the electrodes 22a and 22b. In this case, the plasma processing apparatus 1 may not include the second electrode 22c.

In another embodiment, the plasma processing apparatus may be a capacitively-coupled plasma processing apparatus different from the plasma processing apparatus 1. In another embodiment, the plasma processing apparatus may be another type of plasma processing apparatus. The another type of plasma processing apparatus may be an inductively-coupled plasma processing apparatus, an electron cyclotron resonance (ECR) plasma processing apparatus, or a plasma processing apparatus that generates plasma by using surface waves such as microwaves.

In another embodiment, the voltage levels of the plurality of bias pulses BW may be stepwisely or gradually changed from positive voltage levels to negative voltage levels. Also, in this case, after positive voltage pulses are switched to negative voltage pulses, the absolute values $|V_{BW}|$ of the voltage levels $V_{BW}$ of the plurality of bias pulses BW are stepwisely or gradually increased as described above. Similarly, the voltage levels of the plurality of bias pulses BE may be stepwisely or gradually changed from positive voltage levels to negative voltage levels. Also, in this case, after positive voltage pulses are switched to negative voltage pulses, the absolute values $|V_{BE}|$ of the voltage levels $V_{BE}$ of the plurality of bias pulses BE are stepwisely or gradually increased as described above.

Hereinafter, first to fourth experiments will be described. In the first to fourth experiments, the power of the reflected waves of the radio-frequency power RF in the ignition period Pi was measured by using the plasma processing apparatus 1. In the first to third experiments, the absolute values of the voltage levels of the plurality of bias pulses BW were ramped up from 0 V to 9500 V between the time point t3 and the time point t4 in the ignition period Pi. The time lengths between the time point t3 and the time point t4 in the first to third experiments were 1 second, 2 seconds, and 3 seconds, respectively. In addition, in the fourth experiment, the absolute values of the voltage levels of the plurality of bias pulses BW were stepwisely increased to 2500 V, 6000 V, and 9500 V between the time point t3 and the time point t4 in the ignition period Pi.

Figure 7A:
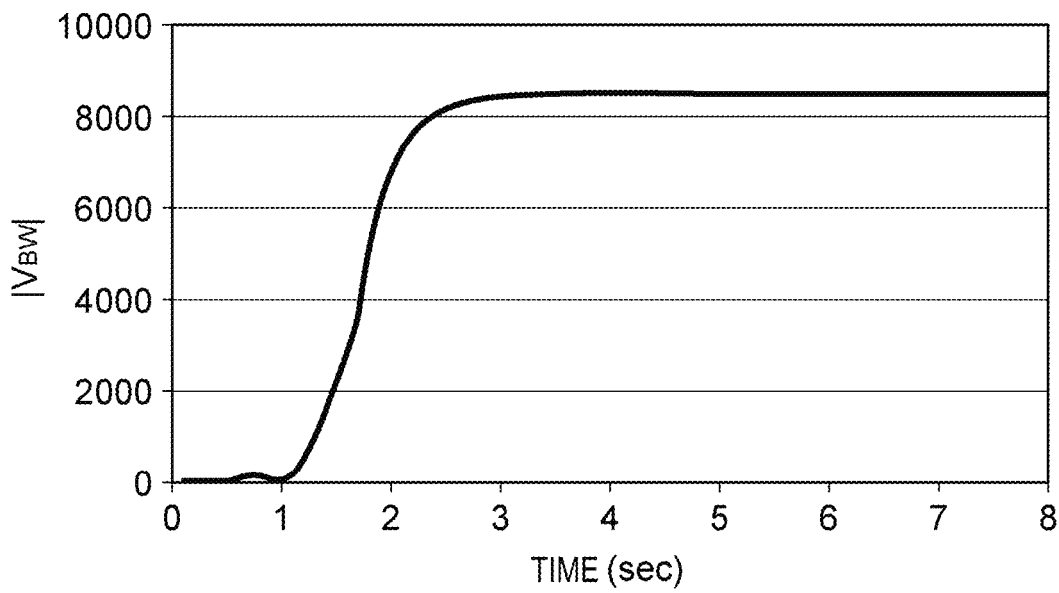
FIGS. 7A and 7B are graphs showing absolute values of voltage levels of bias pulses and reflected waves of radio-frequency power in a first experiment, respectively.
Figure 7B:
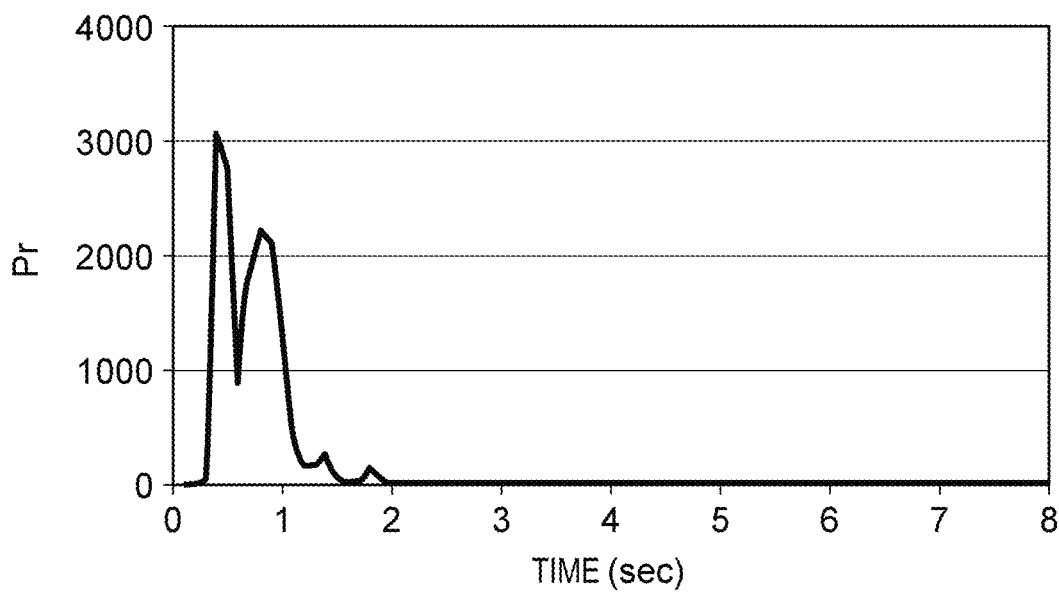
Figure 8A:
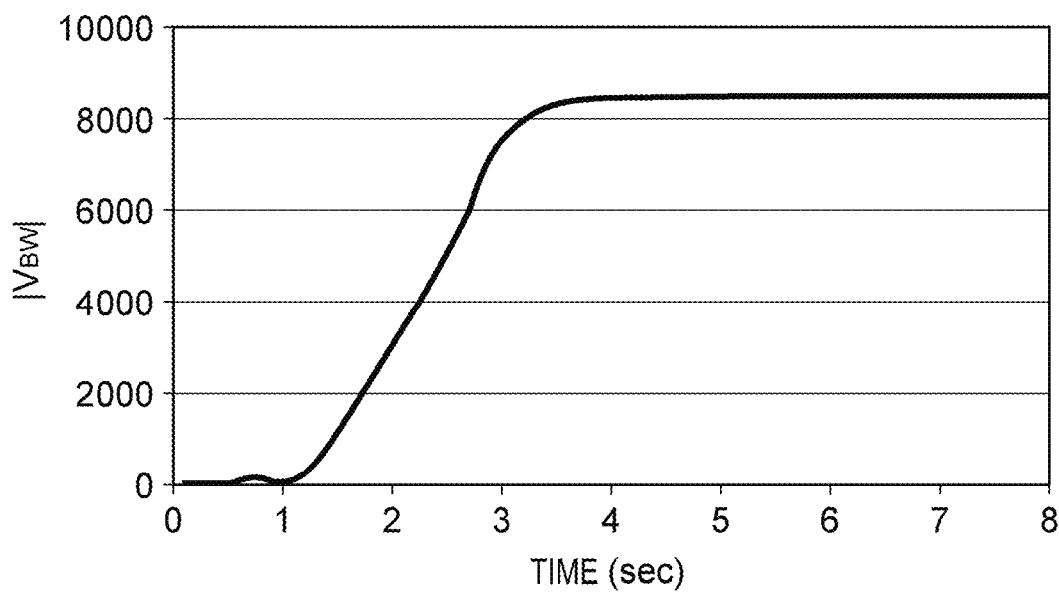
FIGS. 8A and 8B are graphs showing absolute values of voltage levels of bias pulses and reflected waves of radio-frequency power in a second experiment, respectively.
Figure 8B:
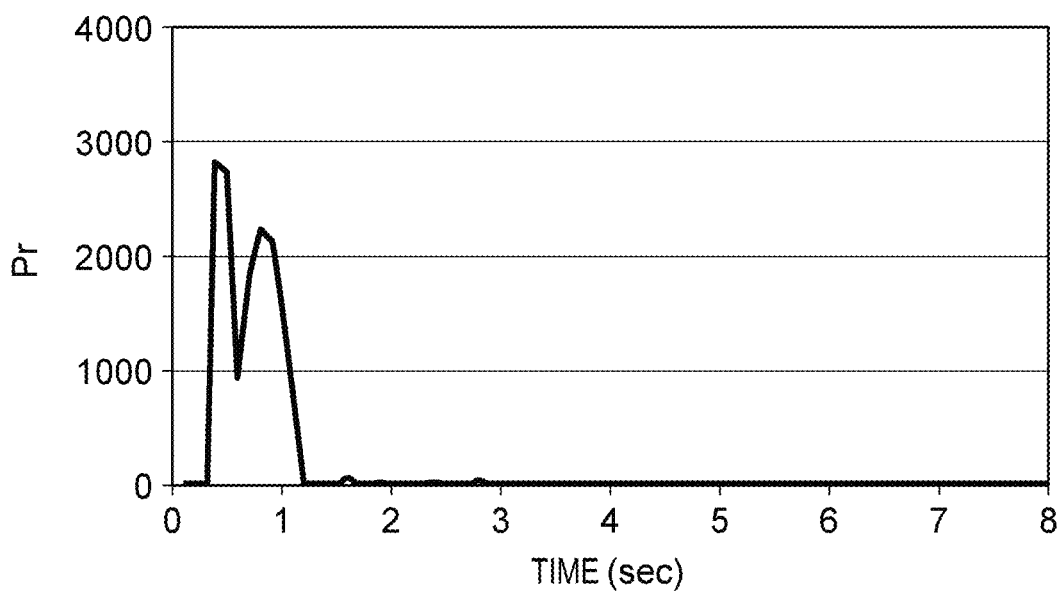
Figure 9A:
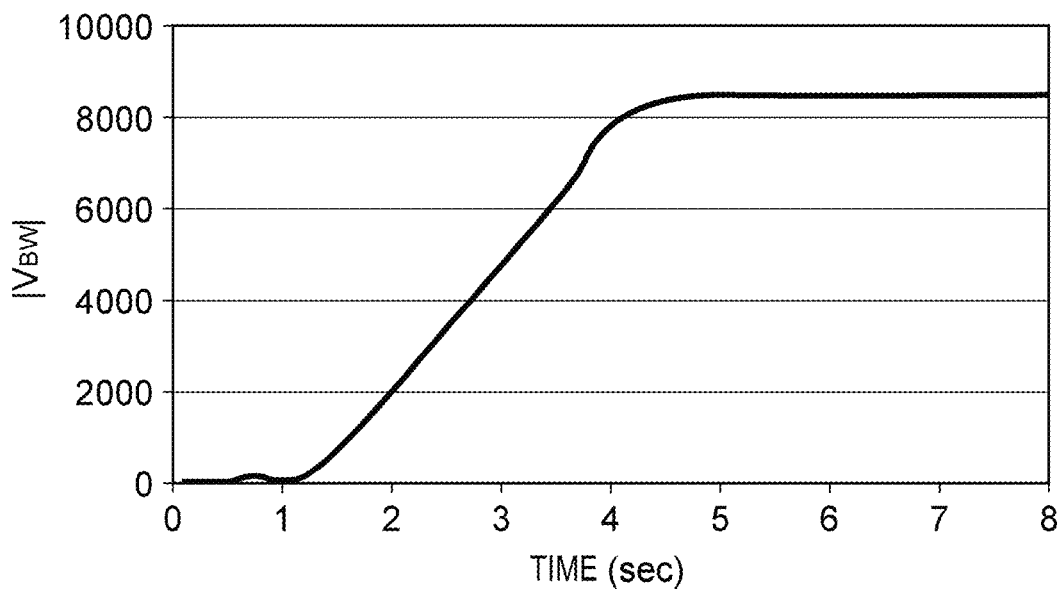
FIGS. 9A and 9B are graphs showing absolute values of voltage levels of bias pulses and reflected waves of radio-frequency power in a third experiment, respectively.
Figure 9B:
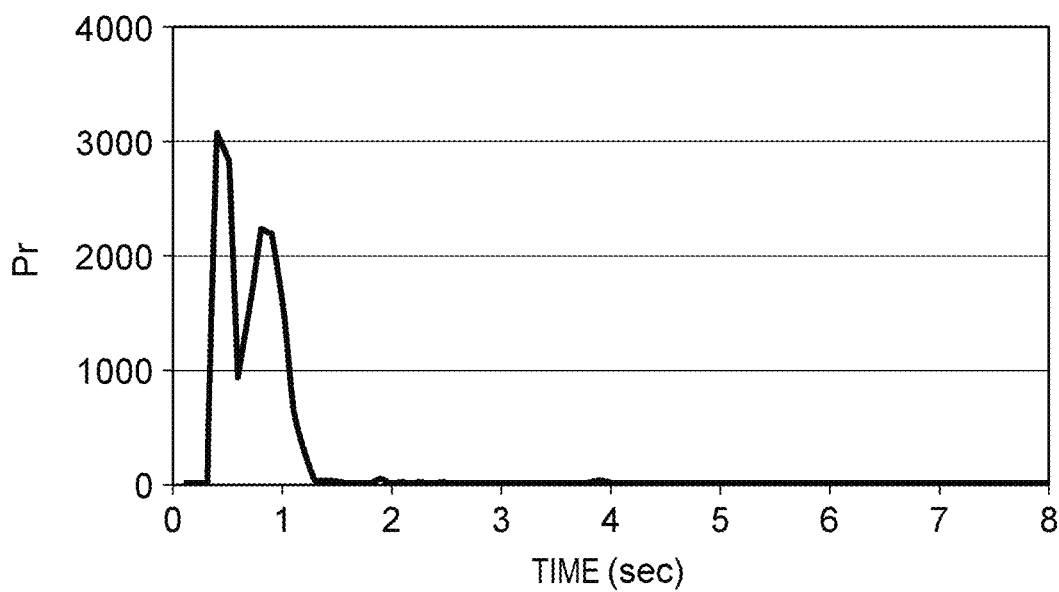
Figure 10A:
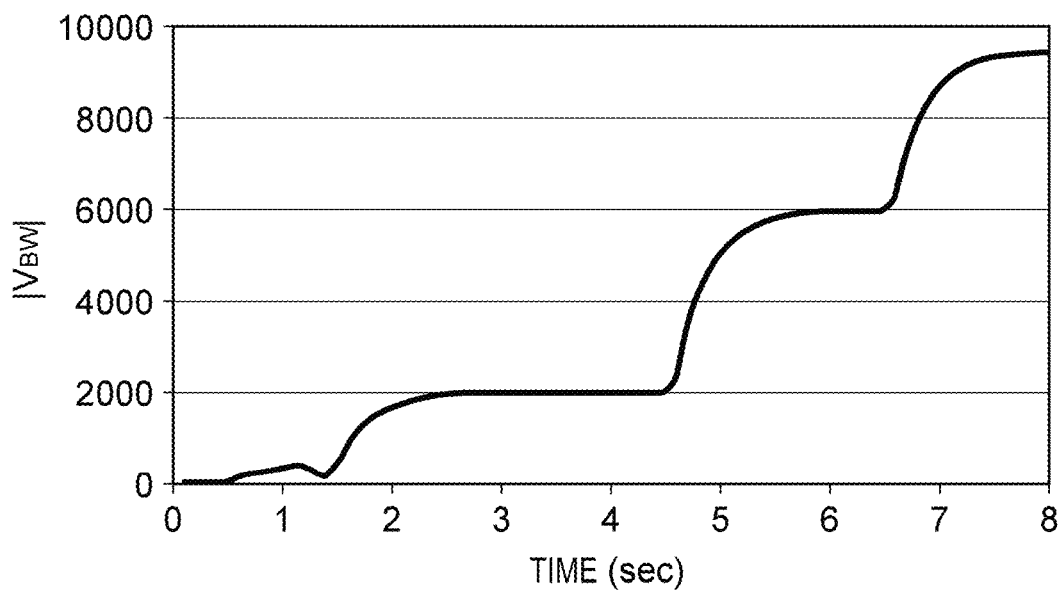
FIGS. 10A and 10B are graphs showing absolute values of voltage levels of bias pulses and reflected waves of radio-frequency power in a fourth experiment, respectively.
Figure 10B:
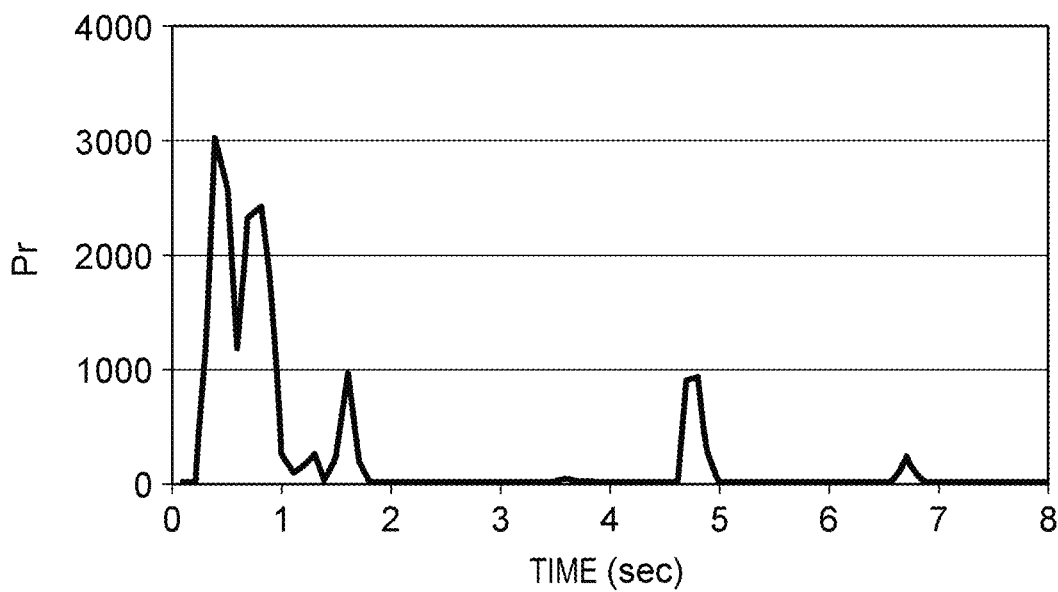

FIGS. 7A and 7B are graphs showing the absolute values $|V_{BW}|$ of the voltage levels of the bias pulses BW and power Pr of the reflected waves of the radio-frequency power RF in the first experiment, respectively. FIGS. 8A and 8B are graphs showing the absolute values $|V_{BW}|$ of the voltage levels of the bias pulses BW and power Pr of the reflected waves of the radio-frequency power RF in the second experiment, respectively. FIGS. 9A and 9B are graphs showing the absolute values $|V_{BW}|$ of the voltage levels of the bias pulses BW and power Pr of the reflected waves of the radio-frequency power RF in the third experiment, respectively. FIGS. 10A and 10B are graphs showing the absolute values $|V_{BW}|$ of the voltage levels of the bias pulses BW and power Pr of the reflected waves of the radio-frequency power RF in the fourth experiment, respectively. As shown in these drawings, it has been confirmed that the power Pr of the reflected waves of the radio-frequency power RF could be reduced by stepwisely or gradually increasing the absolute values $|V_{BW}|$ of the power levels of the plurality of bias pulses BW. In particular, in the third experiment and the fourth experiment, by ramping the absolute values $|V_{BW}|$ from 0 V to 9500 V in a period of 2 seconds or more, the power Pr of the reflected waves of the radio-frequency power RF immediately after the start of the application of the bias pulses BW could be significantly reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing apparatus comprising:
   a chamber;
   a substrate support including an electrode and provided in the chamber;
   a radio-frequency power supply configured to supply radio-frequency power for generating plasma from a gas in the chamber;
   a bias power supply electrically coupled to the electrode; and
   a controller configured to:
      control the radio-frequency power supply to supply the radio-frequency power in an ignition period in which the plasma is ignited in the chamber, and
      control the bias power supply to sequentially apply exclusively negative voltage bias pulses to the electrode in the ignition period, and stepwisely or gradually increase absolute values of voltage levels of the negative voltage bias pulses.

2. The plasma processing apparatus according to claim 1, wherein each of the negative voltage bias pulses is a direct-current voltage pulse.

3. The plasma processing apparatus according to claim 1, wherein the controller is configured to:
   control the radio-frequency power supply to supply the radio-frequency power also in a process period in which a substrate is processed in the chamber using the plasma after the ignition period, and
   control the bias power supply to sequentially apply the negative voltage bias pulses to the electrode also in the process period.

4. The plasma processing apparatus according to claim 3, further comprising:

a pressure controller configured to adjust a pressure in the chamber, wherein
the pressure controller is configured to set a pressure in the chamber in the process period to a pressure different from a pressure in the chamber in the ignition period.

5. The plasma processing apparatus according to claim 4, wherein
the pressure controller is configured to set the pressure in the chamber in the process period to a pressure lower than the pressure in the chamber in the ignition period.

6. The plasma processing apparatus according to claim 3, wherein the controller is configured to control the radio-frequency power supply to set a frequency of the radio-frequency power in the process period to a frequency different from a frequency of the radio-frequency power in the ignition period.

7. The plasma processing apparatus according to claim 6, wherein the controller is configured to control the radio-frequency power supply to set the frequency of the radio-frequency power in the process period to a frequency lower than the frequency of the radio-frequency power in the ignition period.

8. The plasma processing apparatus according to claim 3, wherein the controller is configured to control the radio-frequency power supply to set a power level of the radio-frequency power in the process period to a power level different from a power level of the radio-frequency power in the ignition period.

9. The plasma processing apparatus according to claim 8, wherein the controller is configured to the radio-frequency power supply to set the power level of the radio-frequency power in the process period to a power level higher than the power level of the radio-frequency power in the ignition period.

10. The plasma processing apparatus according to claim 3, further comprising:
a gas supply configured to supply gases from which the plasma is generated in the chamber to the chamber,
wherein the controller is configured to control the gas supply to set a flow rate of at least one gas supplied to the chamber in the process period to a flow rate different from a flow rate of the at least one gas supplied to the chamber in the ignition period.

11. The plasma processing apparatus according to claim 3, wherein
each of the ignition period and the process period includes a plurality of periodic pulse periods, and
the controller is configured to control the bias power supply to apply the negative voltage bias pulses to the electrode in a bias cycle shorter than a pulse cycle that is a time interval of an ON period in the ON period of each of the plurality of pulse periods, and stop the application of the negative voltage bias pulses to the electrode in an OFF period of each of the plurality of pulse periods.

12. The plasma processing apparatus according to claim 11, wherein the controller is configured to control the bias power supply to adjust a duty ratio that is a ratio of a time length of each ON period to a time length of the pulse cycle, and set a duty ratio in the process period to a ratio different from a duty ratio in the ignition period.

13. The plasma processing apparatus according to claim 12, wherein the controller is configured to control the bias power supply to set the duty ratio in the process period to a ratio smaller than the duty ratio in the ignition period.

14. The plasma processing apparatus according to claim 1, wherein
the substrate support is configured to support an edge ring placed thereon, and
the plasma processing apparatus further comprises another bias power supply configured to apply the negative voltage bias pulses to the edge ring.

15. The plasma processing apparatus according to claim 1, wherein the controller is configured to control the bias power supply such that each of the negative voltage bias pulses itself is a constant voltage.

16. The plasma processing apparatus according to claim 1, wherein the ignition period immediately precedes a process period in which a substrate is processed in the chamber using the plasma ignited during the ignition period.

17. The plasma processing apparatus according to claim 16, wherein the controller is configured to control the bias power supply to sequentially apply exclusively negative voltage bias pulses to the electrode during the process period.

18. The plasma processing apparatus according to claim 17, wherein absolute values of voltage levels of the negative voltage bias pulses applied during the process period are constant with respect to one another.

* * * * *